United States Patent [19]

Penney et al.

[11] Patent Number: 4,959,244

[45] Date of Patent: Sep. 25, 1990

[54] TEMPERATURE MEASUREMENT AND CONTROL FOR PHOTOHERMAL PROCESSES

[75] Inventors: Carl M. Penney, Saratoga Springs, N.Y.; Tushar S. Chande, Pittsburgh, Pa.

[73] Assignee: General Electric Company, Schenectady, N.Y.

[21] Appl. No.: 329,054

[22] Filed: Mar. 27, 1989

[51] Int. Cl.$^5$ ............................................. B05D 3/06
[52] U.S. Cl. ................................... 427/53.1; 427/10; 427/248.1; 427/269; 356/48; 356/326; 356/328; 356/334
[58] Field of Search .............. 118/666, 667, 668, 712; 427/531, 8, 10, 248, 1, 249; 356/45, 326, 328, 334

[56] References Cited

U.S. PATENT DOCUMENTS

| | | | |
|---|---|---|---|
| 4,081,215 | 3/1978 | Penney et al. | 356/45 |
| 4,311,725 | 1/1982 | Holland | 427/10 |
| 4,505,945 | 3/1985 | Dubust et al. | 427/8 |
| 4,543,576 | 9/1985 | Hieber et al. | 427/8 |
| 4,582,431 | 4/1986 | Cole | 427/10 |
| 4,676,646 | 4/1987 | Strand et al. | 427/10 |
| 4,699,080 | 10/1987 | Franey | 118/712 |
| 4,713,140 | 12/1987 | Tien | 118/712 |

FOREIGN PATENT DOCUMENTS 0233610 8/1987 European Pat. Off. ............ 118/712

OTHER PUBLICATIONS

D. P. DeWitt, "Inferring Temperature from Optical Radiation Measurements", Optical Engineering, vol. 25, No. 4, Apr. 1986, 596–601.
T. J. Rockstroh et al., "Infrared Thermographic Temperature Measurement During Laser Heat Treatment", Applied Optics, vol. 24, No. 9, May 1985, 1343–1345.
T. J. Rockstroh et al., "Spectroscopic Studies of Plasma During CW Laser Materials Interaction", J. Appl. Physics, vol. 61, No. 3, Feb. 1987, 917–923.
G. B. Hunter et al., "Multiwavelength Pyrometry: An Improved Method", Optical Engineering, vol. 24, No. 6, Nov./Dec. 1985, 1081–1085.
G. B. Hunter et al., "Prototype Device for Multiwavelength Pyrometry", Optical Engineering, vol. 25, No. 11, Nov. 1986, 1222–1231.
J. R. Fincke et al., "Measurement of the Emissivity of Small Particles at Elevated Temperatures", Optical Engineering, vol. 27, No. 8, Aug. 1988, 684–690.
McGraw-Hill Ency. of Science and Technology, 5th ed., 1982, vol. 690–691.

Primary Examiner—Stanley Silverman
Attorney, Agent, or Firm—Paul R. Webb; James C. Davis, Jr.

[57] ABSTRACT

The temperature of a surface undergoing a radiation assisted thermally driven process is sensed by observation of the thermal emission from that surface and used to control the process. In a preferred embodiment, the blue edge of the thermal emission spectral distribution is detected to determine the surface temperature of a workpiece during a process such as laser-assisted chemical vapor deposition, and used to control this temperature. The temperature measuring system has means for focusing workpiece thermal emission and defining the field of view, a spectrometer to separate shorter wavelength light from other spectral components of the thermal emission, and a photon-counting system to detect the shorter wavelength light and generate a surface temperature signal. Systems to determine surface temperature at a spot and along a line have an optical prism to disperse the thermal emission into component wavelengths, and a multichannel photon-counting detector comprised of an intensified photodetector array.

2 Claims, 5 Drawing Sheets

TEMPERATURE MEASUREMENT AND CONTROL FOR PHOTOHERMAL PROCESSES

This invention relates to surface temperature determination during radiation assisted, thermally driven processes and use of this measurement to control the process, and more particularly to using short wavelength thermal emission to measure and control temperature during a chemical vapor deposition (CVD) process.

In both pulsed and continuous wave laser-assisted chemical vapor deposition (LCVD), in applications where the deposition is assisted by laser heating of the surface, the amount of heating cannot be calculated because of changes in absorption and emissivity of the surface as it is modified by the deposition. Likewise because of the unknown variation in emissivity with wavelength, conventional infrared thermography cannot provide accurate temperature measurements. Many other temperature determination approaches, such as those for example using thermocouples, are rendered inaccurate by the strong variations in spatial and/or temporal properties of the laser beam. Temperature measurements are nevertheless desirable, because they appear to provide the most sensitive control parameter for many CVD processes of interest.

The literature and known prior art of LCVD shows no attempts to control surface temperature of the part being processed. Typically, the gases are input at a known temperature and the reaction chamber is maintained at a constant temperature during LCVD.

Conventional LCVD systems have a window in the sealed environment reaction chamber through which the laser beam is transmitted to a workpiece inside the chamber. Delivery of the laser beam via a fiber optic has many advantages. The gaseous reactant can be introduced into the vicinity of the workpiece by means of a gas nozzle on the optical fiber output coupler.

SUMMARY OF THE INVENTION

The short wavelength end of the Planck emission, toward the blue, is used to determine the surface temperature of a workpiece during a radiation assisted thermally driven process, one example of which is laser-assisted CVD. It is known that this component of the thermal emission spectral distribution varies much more strongly with temperature than longer wavelength emission further to the red. Consequently, unknown variations in emissivity will introduce a smaller error into resulting temperature. However, the received detector signal gets weaker rapidly as the selected wavelength is moved toward the blue, i.e. at shorter wavelengths, and less sensitive conventional solid state photodetectors cannot be employed. An element of the invention is the use of a photon-counting detector system to obtain the advantage of reduced emissivity sensitivity in temperature measurements based on observation of thermal emission at the shortest possible wavelengths.

The invention is broadly characterized as a method of controlling a radiation assisted CVD process comprising the steps of delivering radiation to a portion of the surface of a workpiece to cause deposition of gaseous chemical reactants onto the workpiece by radiation heating of the surface, sensing the workpiece surface temperature resulting from this radiation, and utilizing the sensed temperature to control the radiation and the deposition process.

An improved apparatus for a radiation assisted thermally driven process is comprised of a source of radiation and means for delivering radiation to the workpiece surface, a temperature measuring system for determining the temperature of a portion of the surface by detecting thermal emission from that portion and deriving a surface temperature signal, and means responsive to the temperature signal for controlling the radiation source and producing a preselected workpiece surface temperature.

An illustrative embodiment of the invention is an improved apparatus for performing laser-assisted chemical vapor deposition of a gaseous chemical reactant. A laser for generating a laser beam is provided and means for delivering laser energy to heat the surface of the workpiece. A temperature measuring system is comprised of means for focusing the workpiece thermal emission, a spectrometer for separating shorter wavelength light toward the blue edge of the spectrum from other spectral components of the thermal emission, and a photon-counting detector for detecting the shorter wavelength emission and generating a surface temperature signal. Means are provided for utilizing the latter to control the laser and laser beam power and produce a predetermined workpiece surface temperature.

Another aspect of the invention is a workpiece surface temperature measuring system comprising: means for focusing thermal radiation emitted during a chemical vapor deposition process, and defining the field of view; spectrometer means for separating shorter wavelength light from other components of the thermal emission spectrum; and a photon-counting system that detects the shorter wavelength thermal emission and generates a signal representative of the surface temperature. The photon-counting detector typically has multiple channels and is comprised of an image intensifier and a linear or two-dimensional photodetector array, the former when point measurements are made and the latter to make multiple point measurements along a line. Another single channel embodiment has a photomultiplier to detect, by a photon counting technique, short wavelength light passed by an interference filter.

The preferred embodiments of the surface temperature determining system are comprised of: means for focusing thermal emission and defining source location for thermal emission or defining the field of view; means for collimating and dispersing the thermal emission into component wavelength and colors, as by using an optical prism or grating; a multichannel photon-detecting system comprised of an image intensifier and solid state photodetector array to generate in every channel a signal dependent on the intensity of the received component of the spectral distribution; and means for selecting the channel or channels receiving the shortest wavelength emission and outputting the respective detector signal which is indicative of workpiece surface temperature. The photodetector is a linear array or a two-dimensional array in instruments to respectively determine the temperature of a spot and a line on the workpiece surface.

DETAILED DESCRIPTION OF THE INVENTION

Figure 1:
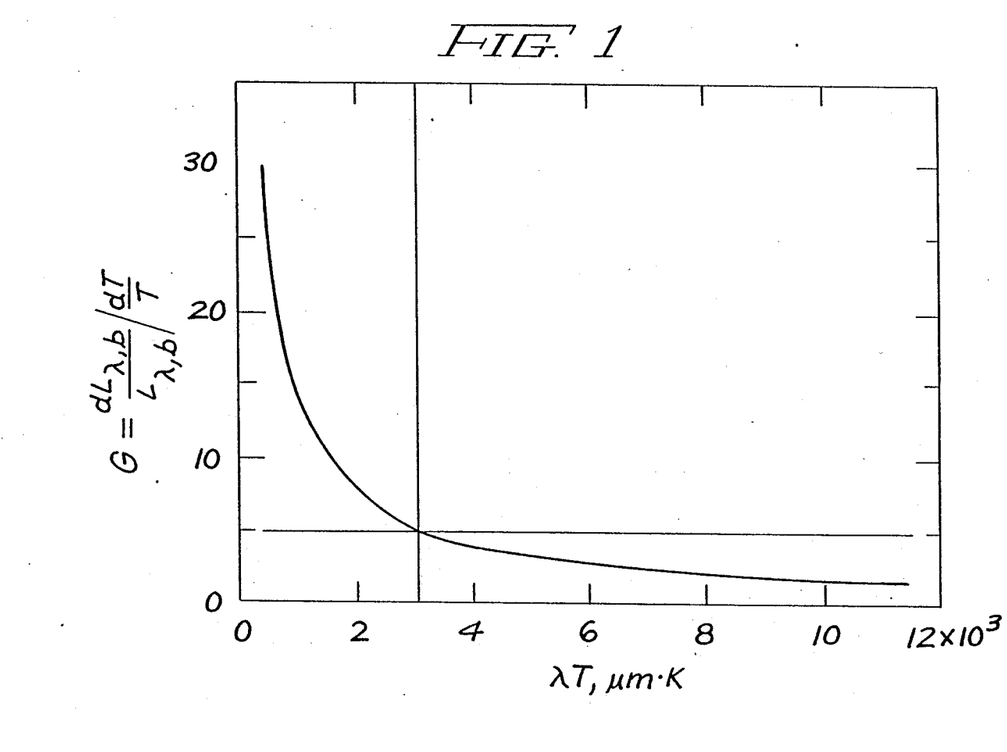
FIG. 1 shows the variation of factor G determining temperature measurement accuracy with the product of wavelength and temperature.

FIG. 1 illustrates the point that a smaller error in temperature results, if there are unknown variations in emissivity, when the short wavelength region of thermal emission is observed to determine temperature. FIG. 1 is drawn from FIG. 4 of the technical paper by D. P. DeWitt, Optical Engineering, Vol. 25, No. 4, 596-601. The figure plots a factor here denoted G, which is the ratio of the fractional change in spectral radiance resulting from a fractional change in temperature, as a function of the wavelength (for a given temperature). The significance of this ratio can be derived as follows: the basic relationship between signal strength S in a particular wavelength channel from a surface at a temperature T is:

$$S_\lambda = K_\lambda e_\lambda L_{\lambda,b}(T) \quad (1)$$

or, suppressing these subscripts, $$S = KeL(T) \quad (1')$$

where L(T) is the blackbody spectral radiance for wavelength $\lambda$ and temperature T, e is the emissivity, and K is a function of wavelength describing performance of the optical system which is known from calibration measurements. The thermal radiation is typically broken up into component colors and there are then a plurality of wavelength channels.

A typical temperature measurement will produce a signal $S_\lambda$ for each wavelength channel but signals from channels toward the blue edge of the detected spectral distribution may be too small to determine accurately because of intrinsic or background noise. Let S stand for the signal from the first channel moving from blue to red along the thermal emission distribution which has a signal due to that emission which is significantly above the noise level. A value for temperature can be calculated from this signal if the emissivity is known, since e and L are the only unmeasured quantities in the equation, and L is known from theory as a function of $\lambda$ and T. In this example case, an accurate value for emissivity is assumed not available. Therefore, it is wished to make the temperature determination as insensitive as possible to emissivity. The determination is made by guessing a value for the emissivity, e.g., which is substituted into equation (1').

$$S = Ke_g L(T_g) \quad (2)$$

This equation is solved to obtain the approximate value for estimated temperature $T_g$. In order to obtain the fractional error in this result ($T-T_g/T$) resulting from an error De in the value of e, $$De = e - e_g \quad (3)$$

the expression for S from equation (1') can be substituted into equation (2):

$$eL(T) = e_g L(T_g) \quad (4)$$

and a first order Taylor expansion may be used $$L(T) = L(t_g) + wDT \quad (5)$$

where $w = |dL/dT|_T$ and $DT = T - T_g$. Then from equations (3), (4) and (5), $$(T - T_g)/T_g = (De/e)(1/G) \quad (6)$$

where small higher order terms have been neglected, as is usual in linearized analysis.

Figure 2:
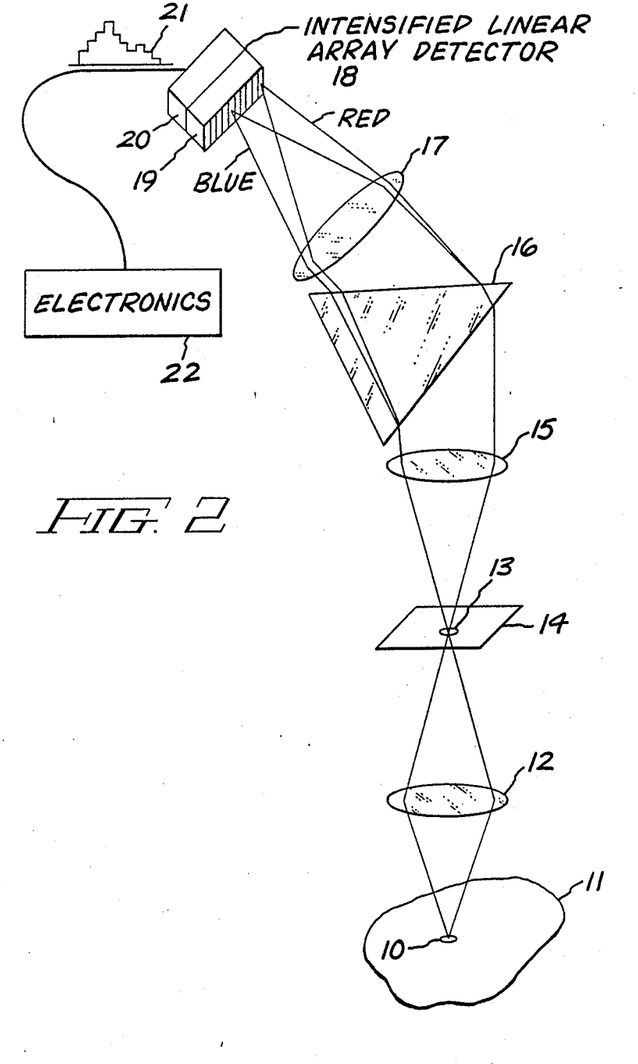
FIG. 2 is a diagram of a spot temperature measuring system using an intensified linear photodetector array.

Thus the fractional error in temperature is equal to the fractional error in emissivity divided by G, which was previously defined. It follows that a large value of G is desirable because that provides the smallest temperature measurement error. From FIG. 1, it is clear that the value of G increases steadily as one makes measurements further to the blue (decreasing values of $\lambda T$ in the range of 500 to 1000 $\mu$m.K). However, the signal also gets weaker rapidly as the sample wavelength is moved toward the blue. Previous temperature measuring instruments based upon observation of thermal emission typically have used solid state detectors which are about one thousand times less sensitive than the photon-counting detectors proposed here. Use of less sensitive detectors prevents full realization of the reduced emissivity sensitivity advantage in temperature measurements. Accordingly, one element is the use of multichannel photon-counting detectors to provide additional accuracy and verification for the temperature measurement. Yet another element is the use of two-dimensional photon-counting detector arrays to provide this advantage along with multiple temperature measurements along a line. Configurations to accomplish these purposes are shown in FIGS. 2 and 5 for a point measurement and FIG. 4 for multiple point measurements along a line. The linear and 2-D photon-counting optical array detectors required for these measurements are now commercially available.

An example of the advantage to be gained through use of photon-counting instruments can be obtained by consideration of a problem typical of a proposed application: temperature measurements are required on a surface of unknown emissivity with time resolution of one millisecond and spatial resolution of 20×20 microns. The approximate temperature of the surface is 1000° C. Using the embodiment of FIG. 2, the number N of detected photons in an optical multichannel analyzer channel is given by:

$$N = \frac{\pi \eta \tau \epsilon T}{4(hc/\lambda)} \frac{Ax^2 yD^2}{F^3} L \quad (7)$$

Here $\eta$ is the quantum efficiency of the detector (counts per photon incident upon the detector channel), $\tau$ is the exposure time, h is Planck's constant, c is the speed of light, D is the effective diameter of the spectrometer collimator, F is the focal length of the focusing collimator, A is the reciprocal dispersion of the prism (or grating in a grating spectrometer), x is the dimension of an individual detector in the direction of dispersion, y is the corresponding orthogonal dimension, T is the optical efficiency, and other quantities are as defined previously. Reasonable engineering assumptions for a spectral channel near 600 nm are:

$$x = y = 20 \text{ microns} = 2 \times 10^{-3} \text{ cm}$$
$$\eta = 0.1$$
$$hc/\lambda = 3 \times 10^{-19} \text{ joules}$$
$$e = 0.2$$
$$D = 2.5 \text{ cm}$$
$$F = 10 \text{ cm}$$
$$A = 5 \times 10^3 \text{ nm/radian}$$
$$T = 0.2$$

Although the signal level depends upon the spatial resolution, that dependence does not appear explicitly in the equation because spatial resolution is determined ultimately by detector pixel size and the magnification of the entrance optics. With the above numbers, a 0.2 millimeter resolution is obtained at a working distance of approximately one meter. Likewise, signal level depends inversely on spectral resolution of each channel, but that quantity is not shown explicitly. Spectral resolution R is given by $$R = A \, x/F \tag{8}$$

and for this case is 1 nm. Using the numbers above and the L-10 spectral emittance for a 1000° C. blackbody, it is found that N=10 at $\lambda$=600 nm. Assuming these counts are detected photons following Poisson statistics, the standard deviation in this measurement is S.D.=$\sqrt{10}$/10=31%, and it would be reasonable to expect a comparable or larger error due to the uncertainty in the emissivity. However, it is noted that at 1000° C. and a wavelength of 0.6 microns, $\lambda T$ is 0.76 and from FIG. 1 factor G is approximately 20. Thus, a measurement done with photon-counting sensitivity on the blue edge of the Planck curve is characterized by a temperature measurement only 1/20 as large as the total uncertainty, or 1.5% in this case. In contrast, a measurement carried out with an unintensified solid state detector array, which is about 1000 times less sensitive than the photon-counting device, would be limited to wavelengths longer than 1.6 microns for these measurement conditions. There, according to FIG. 1, G=7 and the temperature error will be three times larger.

Single or few channel photon-counting filter type instruments such as shown in FIG. 5 can be made much more sensitive than a spectrometer instrument and provide a comparable advantage over their less sensitive counterparts which are presently used extensively for temperature measurements.

The multiple channels in a multiple channel detector can be used to further increase the accuracy of the temperature measurement. For example, the emissivity cannot be larger than 1, so any blue edge error band which includes temperature values for which the emissivity would have to be greater than 1 at a longer wavelength to account for the observed signal could be narrowed to eliminate those temperatures. However, another advantage of multiple channels, in number greater than the two or three channels presently used in some instruments, is to allow temperature measurements over a wide range. This advantage is realized because the most accurate temperature indication is obtained from the first few channels toward the blue side to see a signal, and this channel group shifts rapidly with temperature. For example, if the surface temperature is reduced to 900° C., the first channels to provide a useful signal will be near 670 nm rather than 600 nm. It is noted that at the assumed resolution of 1 nm per channel, this shift is nearly 70 channels. Even another advantage of use of the multichannel detector is provided by its ability to confirm that the observed spectrum is characteristic of thermal emission. This capability allows avoidance of errors that would be introduced by using data containing, for example, absorption or emission lines.

The temperature measurement system in FIG. 2 determines the temperature of a spot 10 on an observed surface 11 using an intensified linear array photodetector. The surface may be on a workpiece in a sealed environment reaction chamber in which is performed a CVD process or a laser-assisted CVD process. The emissivity of the hot surface is not known and changes as it is modified by the deposition. Thermal radiation emitted by the workpiece, particularly from the spot 10 on surface 11, is gathered and focused by a camera lens 12. To define the source location for thermal emission or limit the field of view of the system, a pinhole 13 in a plate 14 is located at the focal point of the lens. Focused thermal emission passing through the pinhole is collimated by a collimating lens 15, and the emerging parallel beam of light falls on an optical prism 16 which disperses and breaks up the light into component wavelengths and colors. Since the index of refraction of optical materials varies with wavelength, the various wavelengths present in the light are deviated by different angles. Thermal emission toward the blue is deviated only a small amount as compared to thermal radiation toward the red edge of the thermal emission spectral distribution.

The component wavelengths emerging from prism 16 are passed through a focusing lens 17 and focused onto different channels of a multichannel photon-counting system, in this case an intensified linear array detector 18 comprised of an image intensifier 19 and solid state photodetector array 20. Focused light toward the blue edge of the spectrum is received by a known group of channels of the linear array detector 18, and light further to the red is detected by another group of channels as is shown in the drawing. The photodetector array 20 is scanned at given intervals and the read out voltage waveform 21 is sent to an electronics unit 22 to be analyzed. Every channel of the intensified linear array detector 18 generates a detector signal whose magnitude depends on the intensity of the received component of the thermal emission spectral distribution. The electronics unit selects the channel or channels receiving shorter wavelength light toward the blue and outputs the respective detector signal which is indicative of the surface temperature of the workpiece. Other functions of the electronics subsystem have been described.

Figure 3:
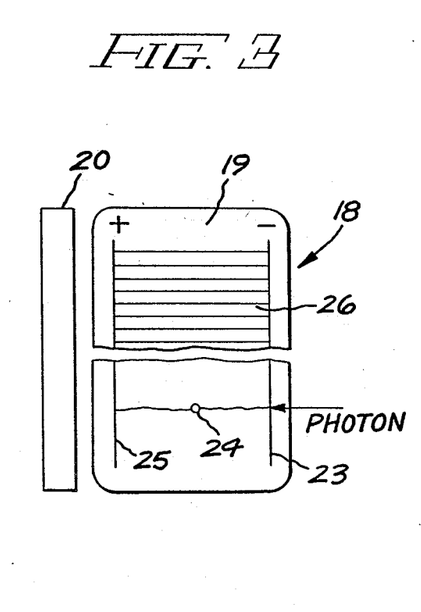
FIG. 3 shows schematically a photon-counting system comprised of an image intensifier and linear photodetector array; the top half of the former has a microchannel plate intensifier and the lower half shows a simple electrostatic intensifier.

The intensified linear array detector 18 and image intensifier 19 are shown in greater detail in FIG. 3. An image intensifier is also known as a light amplifier and is a device which, when actuated by a light image, reproduces a similar image of enhanced brightness, and is capable of operating at very low light levels without introducing spurious brightness variations into the reproduced image. Two types of image intensifiers are illustrated; there are other types that may be used in implementing the invention. The lower half shows a simple electrostatically focused image intensifier. Light strikes a semitransparent photocathode 23 which emits electrons 24 with a density distribution proportional to the distribution of light intensity incident on it. A positively charged phosphor screen 25 at the other side of the intensifier converts the electron energy into visible light. The upper half illustrates a microchannel plate image intensifier which consists of a parallel bundle of small, hollow glass cylinders 26, where the inside walls of the cylinders are coated with a secondary emitting material. Electrons emitted from the photocathode 23 strike the inside walls of the cylinders 26, causing secondary electron generation. The secondary electrons in turn continue to cascade down the inside walls of the cylinders to the phosphor screen 25, resulting in a high total current gain. Integrated circuit detector array 20 is comprised of a large number of parallel lines of individual photosensitive areas and the circuitry necessary to read the cells individually. Either charge-coupled device (CCD), charge-injection device (CID), or bipolar photodiode technologies can be employed. Roughly 1000 or so photons are needed to get a measurable signal. Thus an image intensifier providing a useful gain of 1000 will allow detection of single photons.

Figure 4:
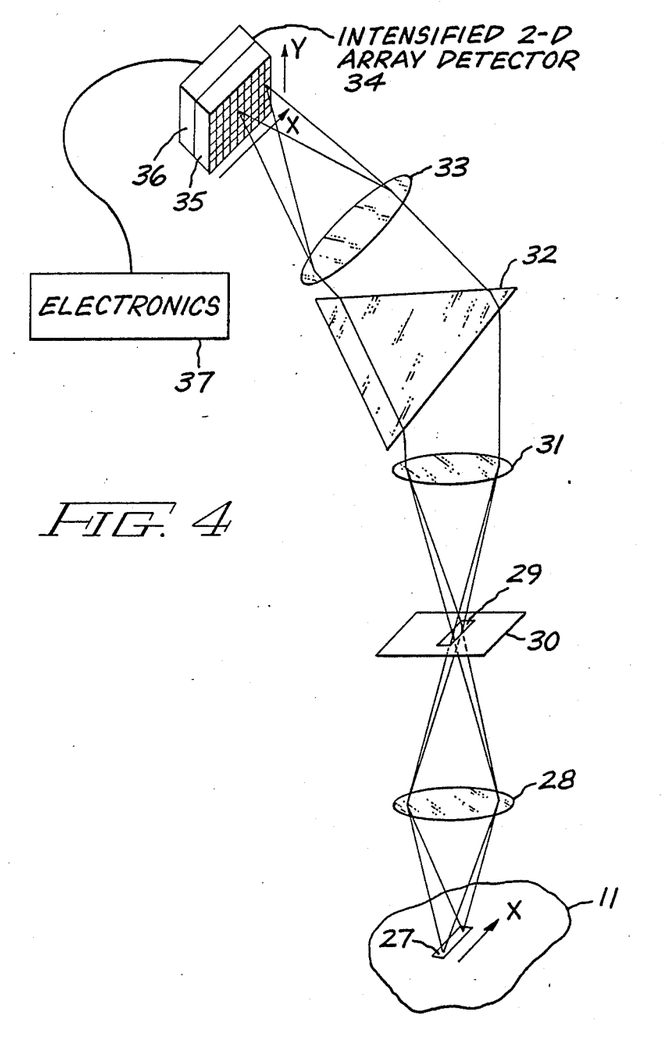
FIG. 4 illustrates a system for line temperature measurement using an intensified 2-D detector array.
Figure 5:
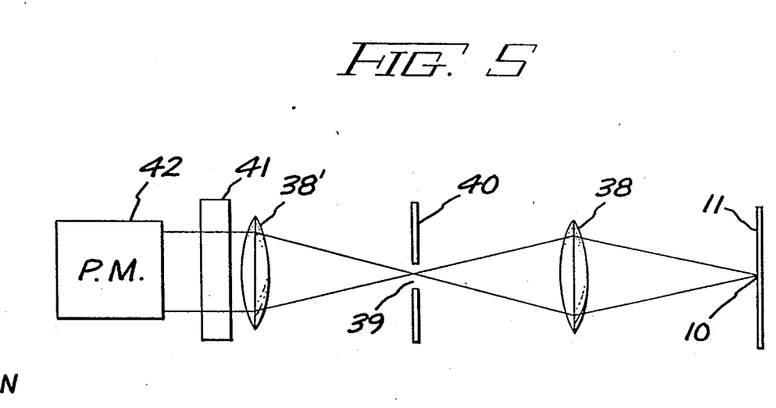
FIG. 5 shows another point temperature measuring system having an interference filter to pass short wavelength thermal radiation to a photomultiplier.

FIG. 4 shows a temperature measuring system for making line temperature measurements using an intensified 2-D detector array. The surface temperature of multiple points along a line 27 on the observed surface 11 are determined. Thermal emission from the plurality of points on the hot surface is focused by a camera lens 28 onto a slit 29 in a plate 30 which defines the field of view of the system. The focused thermal emission passing through the slit is presented to a collimating lens 31. The parallel beam of light is dispersed into component wavelengths and colors by an optical prism 32, and the different colors are focused by a lens 33 onto an intensified 2-D array detector 34 which is comprised of an image intensifier 35 and a solid state 2-D photodetector array 36.

The optical system is such that thermal radiation emitted from points along the line 27 in the x direction are detected at separate channels along the x dimension of the intensified 2-D array detector 34. The component wavelengths λ of the thermal emission spread out along channels in the orthogonal direction as shown in the figure. The electronic system 37 analyzes the read out detector signals, vertical channel by vertical channel, and selects the channel receiving shorter wavelength light toward the blue, and outputs that detector signal which is indicative of the surface temperature of the workpiece at a given point along line 27. This is done for every point along the line.

In the embodiments of FIGS. 2 and 4, a prism spectrometer is used to break up the light beam into its component colors and discover what wavelengths are present in the light beam. A diffraction grating may be used as the spectrometer instead of a prism as a means of dispersing the light beam into spectra. If the grating spacing is known, then from a measurement of the angle of deviation of any wavelength, the value of this wavelength may be computed. The point temperature measurement system in FIG. 5 has a one-channel spectrometer in the form of an interference filter, and a single channel photon-counting system is comprised of a photomultiplier tube. Thermal emission from a spot 10 on the observed surface 11 is focused by a camera lens 38 and passes through a pinhole 39 in a stop plate 40 that serves to define and limit the field of view of the temperature measurement system. Parallel rays from a collimating lens 38' are incident on an interference filter 41 which selects a particular wavelength light to pass, toward the blue edge. A photomultiplier 42 detects incident photons of light and has an output voltage dependent on the number of photons and the intensity of the received light. To provide a multichannel version of this system (not here illustrated), the interference filter can be tilted to isolate the color channels or there may be more than one filter. There are a plurality of photomultiplier detectors, one for every color channel. Refer to U.S. Pat. No. 4,081,215, Penney and Lapp, "Stable Two-Channel, Single-Filter Spectrometer", the disclosure of which is incorporated herein by reference.

Figure 6:
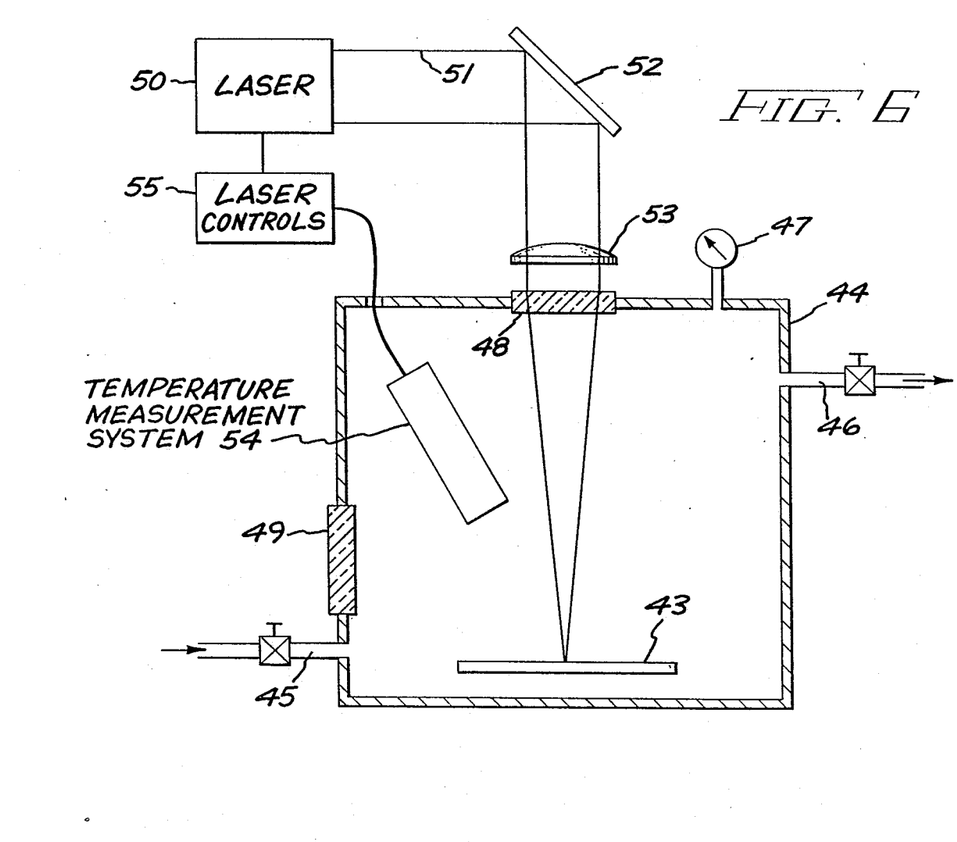
FIG. 6 illustrates a laser chemical vapor deposition apparatus and an improved temperature control using short wavelength thermal emission.

Temperature control for laser chemical vapor deposition using short wavelength thermal emission is illustrated in FIG. 6. This is a process in which a laser beam heats the surface and facilitates the deposition of gaseous chemical reactants onto the workpiece. A typical prior art LCVD system is shown here. A workpiece 43 is positioned within a sealed environment reaction chamber 44 having a reactant gas inlet port 45, a gas outlet port 46, and a pressure gage 47. A window 48 suitable for the transmission of a laser beam and an observation window 49 for viewing the workpiece are provided. A laser 50 generates a collimated laser beam 51 that is reflected by a mirror 52 and focused by lens 53. The laser beam passes through window 48 and is focused to a spot on the surface of workpiece 43. Laser-assisted deposition of the gaseous chemical reactants onto the workpiece occurs either by a process of photolysis in which the laser beam causes the molecules of the gaseous reactant to dissociate and react with the substrate material or by a process of pyrolysis in which the laser beam heats the substrate and the gaseous reactant reacts directly with the substrate.

Temperature control is achieved using a temperature measurement system 54 of this invention to continuously determine workpiece surface temperature. The temperature signal generated by the system is supplied to the laser controls 55 which controls the laser 50 and the laser beam power to adjust surface temperature to a predetermined value. Alternatively, the laser beam may be delivered to the workpiece via an optical fiber.

Some of the many applications of the invention are temperature determination and control during continuous and pulsed laser-assisted CVD of oxides, nitrides or carbides on steel surfaces.

The invention is applicable to other radiation assisted, thermally driven processes, which are also known as photothermal processes. Examples are the heat treatment of a surface to cause surface components to diffuse into the material, and processes to recrystallize a surface.

While the invention has been particularly shown and described with reference to several preferred embodiments, it will be understood by those skilled in the art that the foregoing and other changes in form and details may be made without departing from the spirit and scope of the invention as defined in the appended claims.

What is claimed is:

1. A method of controlling a radiation assisted chemical vapor deposition process comprising:
    delivering radiation to a portion of the surface of a workpiece to cause deposition of gaseous chemical reactants onto the workpiece by radiation heating;

sensing the workpiece surface temperature resulting from said radiation by detecting thermal emission from said workpiece toward the short wavelength edge of the thermal emission spectrum and deriving therefrom a surface temperature signal; and utilizing the sensed surface temperature to control said radiation and deposition process.

2. The method of claim 1 wherein said radiation is laser radiation, and said utilizing comprises using said temperature signal to control a laser and laser beam power to produce a preselected workpiece surface temperature.

* * * * *